Nov. 26, 1968 W. B. HARRIS 3,413,569
REPETITIVELY OPERATING THYRISTOR SWITCH CIRCUIT
WITH RAPID TURN-OFF ACTION
Filed May 19, 1967 2 Sheets-Sheet 1

INVENTOR
W. B. HARRIS
BY
B. F. Stoddard
ATTORNEY

United States Patent Office 3,413,569

Patented Nov. 26, 1968

3,413,569

REPETITIVELY OPERATING THYRISTOR SWITCH CIRCUIT WITH RAPID TURN-OFF ACTION

William B. Harris, Bernardsville, N.J., assignor to Bell Telephone Laboratories, Incorporated, Murray Hill, N.J., a corporation of New York Filed May 19, 1967, Ser. No. 639,714
3 Claims. (Cl. 331—111)

ABSTRACT OF THE DISCLOSURE

Square wave generators based on multivibrator circuits generally require two tubes or transistors for repetitively triggering one from the other. It has been discovered that a switch circuit employing a single thyristor can be adapted to function as an astable oscillator by connecting a Zener diode between the source of pulse current and the gate of the thyristor.

*Background of the invention*

This invention relates to improved semiconductor switch circuits capable of operating at rapid speeds in high power circuits for producing rectangular pulses having fast fall times.

Semiconductor switches of the prior art have generally used four-layer pnpn devices known as silicon controlled rectifiers or thyristors. As is well known, a pnpn device is usually provided with three terminals and has properties somewhat analogous to a gas-filled thyratron and, like the thyratron, once it is switched on, it remains conductive until a turn-off device is operated. Although the operating speed of the thyristor is inherently much greater than that of the thryatron, some utilization circuits require faster operating speeds than those for which a thyristor is inherently capable.

The need for faster operating speeds has been met by a prior art thyristor switch circuit which is disclosed and claimed in a copending patent application filed by W. B. Harris, R. P. Massey and F. J. Zgebura. This prior application, bearing Ser. No. 537,544, was filed on Mar. 25, 1966 and is assigned to the same assignee as the present application. The circuit of this copending application is described in detail hereinafter with reference to FIG. 1 of the drawing wherein it can be seen that the switch circuit employs a single thyristor and a conventional reverse current turn-off circuit. An impedance is connected between the gate and cathode of the thyristor to reduce false triggering from the rate effect. Both the rate effect and the turn-off capabilities are improved by connecting a diode between the gate and cathode of the thyristor, and another diode between the gate and anode of the thyristor. These diodes are so constructed that the reverse recovery time of the middle junction in the thyristor is less than that of the first diode and greater than that of the second diode.

Although this prior art circuit has made it possible to reduce the turn-off time of a thyristor switch to one-half or less of its inherent turn-off time, it is not fully satisfactory for all purposes. The reason for this is that a pulse produced by this switch circuit has a relatively slow fall time due to the capacity effect inherent in the load, or utilization circuit, and also to residual energy stored in the turn-off circuit.

Another objection is that, when this switch circuit is used as a free-running square wave oscillator or multivibrator, it has heretofore been necessary to add a second thyristor or transistor to the circuit for continuously or repetitively triggering one thyristor from the other.

*Summary of the invention*

The present invention is designed to improve the above-identified prior art switch circuit by overcoming the objections discussed above. Accordingly, the primary object of this invention is to modify the above-mentioned switch circuit so that its single thyristor will function as a free-running square wave generator or multivibrator without requiring a second thyristor or transistor and without employing an external source of trigger pulse current. Another object of the invention is to adapt this modified switch circuit for materially shortening the fall time of each pulse that it generates.

The first of these objects is attained by repetitively firing the single thyristor with current from the same source that provides the pulse current. The firing of the thyristor is regulated by means of a threshold control which prevents current from being applied to the gate terminal of the thyristor until it has reached a preassigned value. In an exemplary embodiment of the invention, the threshold control is provided by the value of the reverse breakdown voltage of a Zener diode having a fast reverse recovery time. This Zener diode has its anode connected to the gate terminal of the thyristor, and has its cathode coupled to the source of pulse current.

The second of the above objects is accomplished by connecting across the load resistor a circuit comprising a resistor in series with a step recovery diode. The connections from the resonant turn-off circuit are modified so that one of its leads extends to a point that is connected beween the step recovery diode and its resistor. The abrupt reverse step of the step recovery diode is utilized for terminating each pulse in a sudden fall time.

*Brief description of the drawing*

The features of this invention are fully discussed hereinafter in relation to the following detailed description of the drawing in which.

*Detailed description*

Figure 1:
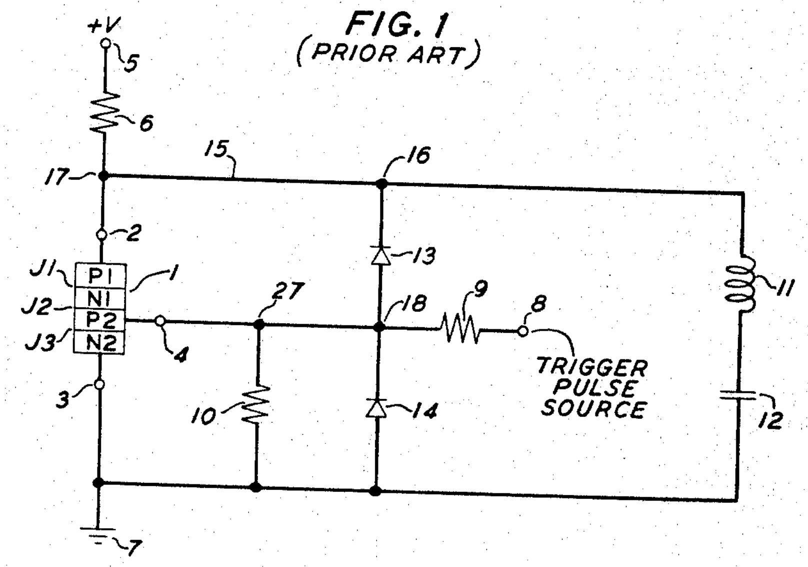
FIG. 1 (PRIOR ART)
FIG. 1 discloses the thyristor switch circuit of the above-mentioned copending application.

The switch circuit of the above-mentioned copending patent application is shown in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A power supply source of direct voltage has its positive side connected to a terminal 5. The terminal 5 is coupled through a utilization circuit, which is represented symbolically by a load resistor 6, to the anode terminal 2. The cathode terminal 3 is connected to a source 7 of ground potential which is to be understood as being connected to the negative side of the source of direct voltage.

The switch circuit further includes a source 8 of trigger pulse current which is coupled through a resistor 9 and the points 18 and 27 to the gate terminal 4. A resistor 10 is connected between the point 27 and the source 7 of ground potential. As is well known in the art, a positive trigger pulse from the source 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point, attention should be directed to a resonant turn-off circuit that comprises an inductor 11 and a capacitor 12 which are serially connected across the anode terminal 2 and the cathode terminal 3. Prior to the triggering of the thyristor 1, the capacitor 12 is charged to the same potential as that of the source 5 of direct voltage. When the thyristor is triggered, it becomes conductive and initiates the generation of a pulse across the load resistor 6. Also, at this time, the capacitor 12 discharges and initiates a flow of ringing current. The first half-cycle of this ringing current flows from the capacitor 12 through the inductor 11, over the lead 15, through the thyristor 1 in the forward direction, and then back to the capacitor 12.

At the beginning of the second half-cycle, the ringing current reverses in phase and flows through the thyristor 1 in the reverse direction. The values of the capacitor 12 and the inductor 11 are so selected as to cause the magnitude of the reverse ringing current to quickly exceed the magnitude of the normal load current. This produces a net reverse current which flows from the cathode terminal 3, through all three of the junctions J3, J2, and J1, and then to the anode terminal 2.

In order to reduce the time required to restore the forward-blocking capability of the thyristor 1 and also to improve its dynamic breakdown capability, two diodes 13 and 14 are serially connected across the anode terminal 2 and the cathode terminal 3, and are also connected across the inductor 11 and the capacitor 12. It can be seen in FIG. 1 that this connection uses the lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that, at the beginning of the second half-cycle of the ringing current, the ringing current will be a reverse current for the two outer junctions J1 and J3 but will be a forward current for the middle junction J2. Therefore, the slow recovery diode 14 will be momentarily reverse biased by the charge stored in the lower junction J3 while the fast recovery diode 13 will be biased below its threshold voltage by the opposed charges in junctions J1 and J2. This condition of the diodes 13 and 14 permits the reverse ringing current to flow through the thyristor 1 at the start of the second half-cycle.

The flow of reverse ringing current quickly functions to reduce the charge density in junction J3 to zero thereby causing it to recover and open. During the transition in junction J3, current will begin to flow through the lower diode 14 and will increase to the point at which the diode 14 will be carrying all of the reverse ringing current. At this time, the reverse current will flow from the capacitor 12, through the lower diode 14, through the gate terminal 4 and into the middle junction J2, out through the upper junction J1, and then to the inductor 11. Thus, the recovery of the lower junction J3 does not terminate the pulse since the pulse current across the load resistor 6 is maintained because it is superimposed upon the reverse ringing current which is now flowing through the lower diode 14.

Since the reverse ringing current is also a reverse current for the upper junction J1, the junction J1 will partially recover during the time that the lower junction J3 is carrying reverse current. After the lower junction J3 fully recovers, the above-described flow of reverse current through the lower diode 14 and the middle junction J2 will force the upper junction J1 to complete its recovery thereby reducing its charge density to zero. In other words, the upper junction J1 is forced to recover due to a forward current flowing through the middle junction J2.

While this change in junction J1 is occurring, the current flowing through junctions J1 and J2 will be reduced toward zero and the current flowing through the fast recovery diode 13 will be correspondingly increased to the limit of the reverse ringing current. This flow of current through the upper diode 13 will cause an additional charge to be stored in the lower diode 14. It should be noted that, since the middle junction J2 had been forward biased, the charge density now existing in this junction J2 is not zero and it begins to recover by recombination. The thyristor 1 is now open at both junctions J1 and J3 and further reverse current is unnecessary except to store more charge in the slow recovery diode 14.

During the latter portion of the second half-cycle of ringing current, the magnitude of the ringing current becomes smaller than the magnitude of the load current, and, since the reverse recovery time of the upper diode 13 is less than the reverse recovery time of the middle junction J2, the diode 13 recovers and a second forward current is now applied to the thyristor 1. This current flows in the forward direction through the upper junction J1 and in the reverse direction through the middle junction J2 and the lower diode 14. Accordingly, this current forces the middle junction J2 to recover before the diode 14 recovers by recombination. The recovery of the middle junction J2 turns off the thyristor 1 thereby terminating the pulse. Shortly thereafter, when the diode 14 finally completes its recovery, the switch circuit becomes ready for generating another pulse.

By thus designing diode 14 to recover more slowly than the middle junction J2, gate triggering of the thyristor 1 is prevented, as is explained in the above-mentioned copending patent application, by providing a low impedance between the cathode terminal 3 and the gate terminal 4 for a short interval after the thyristor 1 recovers and thus improves the rate effect capability of this switch circuit.

Figure 2:
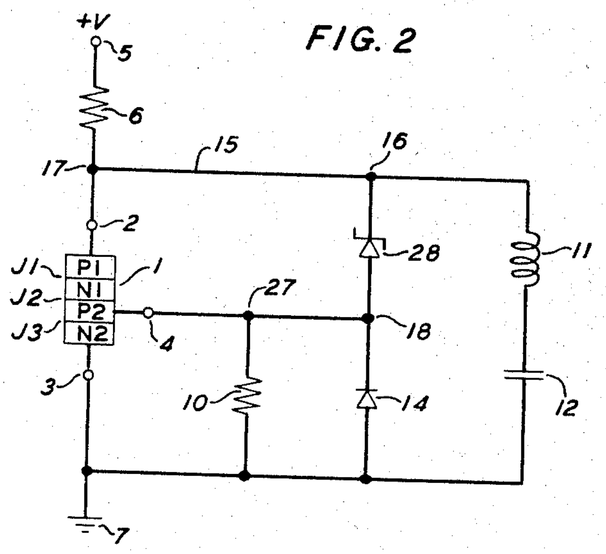
FIG. 2 shows the circuit of FIG. 1 modified in accordance with the present invention for functioning as a free-running square wave generator.

As was stated previously, when the above-described thyristor switch has been used as a free-running square wave oscillator or multivibrator, it has heretofore been necessary to add a second thyristor or transistor to the circuit in order to repetitively trigger one thyristor from the other. However, the necessity for using such a second thyristor is avoided by modifying the circuit of FIG. 1 in accordance with this invention as is illustrated in FIG. 2. Since the circuit of FIG. 2 is a modification of the circuit of FIG. 1, those elements of FIG. 2 that are the same as those in FIG. 1 are identified with the same reference designations.

When the circuit of FIG. 2 is compared with the circuit of FIG. 1, it can be seen that the resistor 9 and the source 8 of trigger pulse current have been omitted. It can also be seen that the fast recovery diode 13 has been replaced by a Zener diode 28 having a fast reverse recovery time which is the same as that of the diode 13 and, therefore, is less than the reverse recovery time of the middle junction J2 in the thyristor 1.This Zener diode is also so constructed as to have a specific reverse breakdown voltage value.

The thyristor circuit of FIG. 2 is normally open, as was the case with the circuit of FIG. 1, due to the relatively high impedance that now exists between the anode terminal 2 and the cathode terminal 3 of the thyristor 1. Since there is no conventional source of trigger pulse current in the circuit of FIG. 2, the circuit is put into operation by causing the power supply voltage at the source 5 to have a value greater than the reverse breakdown voltage of the Zener diode 28 thereby effecting its breakdown. This enables current from the source 5 to flow through the load resistor 6 to the point 16, and then in the reverse direction through the Zener diode 28 to the gate terminal 4 thereby triggering the thyristor 1 and starting the formation of the leading edge of a square wave pulse.

At this time, the capacitor 12, which had been charged by current from the source 5, discharges and initiates a flow of ringing current through the inductor 11, over the lead 15, and through the thyristor 1 in the forward direction. During the second half-cycle of the ringing current, which, as was explained above, flows in the reverse direction, the fast recovery Zener diode 28 functions in the same manner as that described above for the fast recovery diode 13 thus assisting the thyristor 1 to recover quickly its forward-blocking capability and to thereby terminate the generation of the square wave pulse.

The turning-off of the thyristor 1 causes charging voltage to again be applied to the capacitor 12 over a path extending from the power supply source 5, through the load resistor 6 to the point 16, and then through the inductor 11 to the capacitor 12. During this charging period, the slow recovery diode 14 recovers by recombination. When the potential at the point 16 reaches a value that is greater than the reverse breakdown voltage of the Zener diode 28, it effects the breakdown of the Zener diode 28. Current from the source 5 will now flow through the Zener diode 28 and into the gate terminal 4 of the thyristor 1. This current again functions as triggering current for firing the thyristor 1 and thereby starting the generation of another pulse across the load resistor 6. Thus, the value of the reverse breakdown voltage of the Zener diode 28 serves as a threshold control for preventing current from the source 5 from being applied to the gate terminal 4 of the thyristor 1 until the potential at the point 16 has reached a preassigned value.

This second pulse will be terminated in the same manner as that described above and charging current will again be applied through the point 16 to the capacitor 12. When the potential at the point 16 reaches the necessary value, it will again effect the breakdown of the Zener diode 28 thereby initiating the generation of another pulse. As this procedure will be repeated continuously, it can be understood that the circuit of FIG. 2 will operate to repetitively generate a succession of square wave pulses without requiring a second thyristor and without employing an external source of trigger pulse current. In other words, this circuit functions in the manner of an astable oscillator or multibribrator.

The cyclical generation of pulses produced by the circuit of FIG. 2 can be terminated when desired by simply reducing the value of the voltage from the power supply source 5 so that the point 16 will not be able to acquire a potential sufficient to effect the breakdown of the Zener diode 28.

It should be noted that the interpulse spacing or frequency of the pulses is determined by the time required for the point 16 to acquire a potential sufficient to effect the breakdown of the Zener diode 28. The frequency of the pulses can be varied by suitably adjusting the values of one or more of the circuit components, such as the load resistor 6, the inductor 11, or the capacitor 12.

It was stated above that the Zener diode 28 has a fast reverse recovery time which is the same as the reverse recovery time of the diode 13 in the circuit of FIG. 1. Since it was also stated above that the reverse recovery time of the diode 13 is less than the reverse recovery time of the middle junction J2 in the thyristor 1, it necessarily follows that the reverse recovery time of the Zener diode

28 is less than the reverse recovery time of the junction J2.

Figure 3:
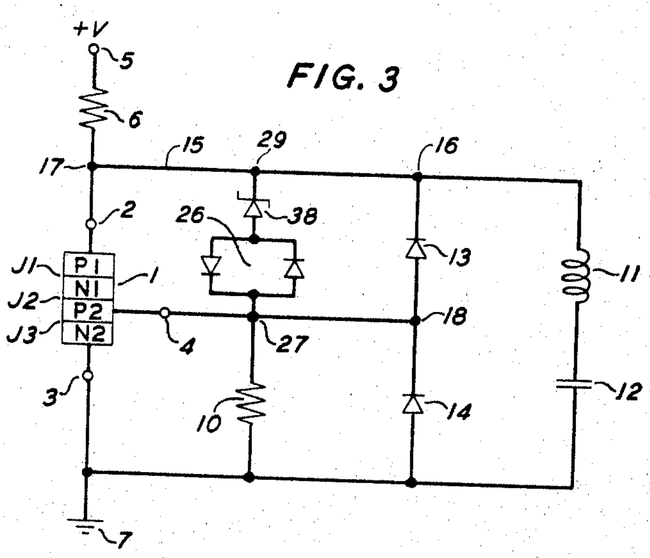
FIG. 3 is similar to FIG. 2 except that it includes a representation of an alternative circuit construction.

At the present state of the art, there is no available Zener diode having the desired fast reverse recovery time. However, this can be simulated by a circuit construction that is shown in FIG. 3. Since FIG. 3 is another modification of the circuit shown in FIG. 1, the same reference designations are used in each circuit for identifying elements that are common to both of them. It can be seen in FIG. 3, that a conventional Zener diode 38 is connected in parallel with the fast reverse recovery diode 13. Also, a varistor network 26 is connected in series with the Zener diode 38. This variator network 26 comprises a pair of oppositely disposed diodes connected in parallel.

More specifically, a point 29 on the lead 15 is connected to the cathode of the Zener diode 38, the anode of the Zener diode 38 is connected to one side of the varistor network 26, and the other side of the network 26 is connected to a point 27 on the lead extending from the gate terminal 4 of the thyristor 1 to the midpoint 18 between the diodes 13 and 14. Thus, the series combination of the Zener diode 38 and the varistor network 26 is shunted by the fast recovery diode 13.

The function of the varistor network 26 is to provide an additional forward voltage drop in series with the Zener diode 38 so as to insure that the fast recovery diode 13 will conduct all of the current in the forward direction. It is to be understood that the entire circuit construction 13–26–38 is equivalent to the Zener diode 28 shown in FIG. 2 and that it functions in the same manner for causing the thyristor switch circuit to operate as an astable oscillator.

The switch circuits of FIGS. 1, 2, and 3 each have in common the advantage of possessing a fast operating speed for producing pulses. However, they are not fully satisfactory for all purposes because a pulse produced by any one of these switch circuits has a relatively slow fall time due to the capacity effect inherent in the load and also to residual energy stored in the turn-off circuit. A substantially shorter fall time can be obtained by modifying these circuits in the manner shown in FIG. 4. Since the thyristor switch circuit of FIG. 4 is a modification of the circuits of FIGS. 1, 2, and 3, the same reference designations are used in each circuit for identifying elements that are common to all of them.

Figure 4:
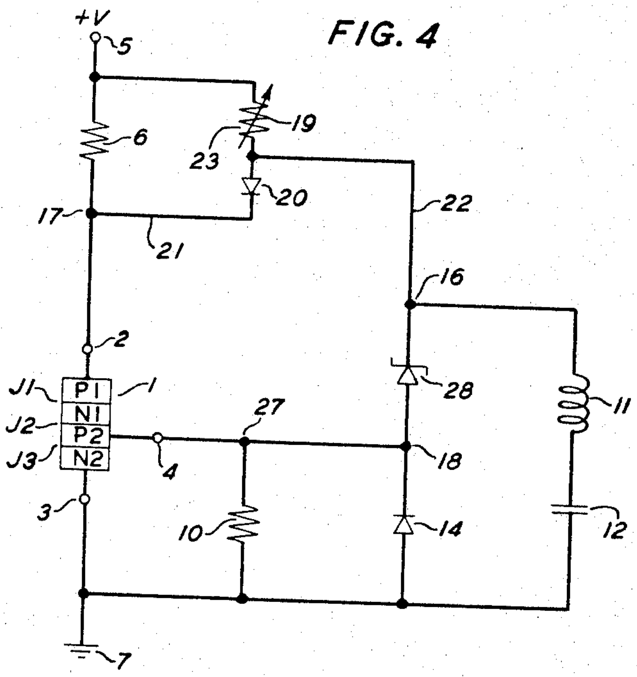
FIG. 4 illustrates the manner in which a step recovery diode is added to the circuit of FIG. 2 for substantially shortening the fall time of a pulse generated by this circuit.

When the circuit of FIG. 4 is compared with the other circuits, it can be seen that a significant distinction is that, in the circuit of FIG. 4, the utilization circuit, which is represented symbolically by the load resistor 6, is provided with a parallelly connected circuit comprising a serially connected variable resistor 19 and a diode 20. The diode 20 is of the type known to those skilled in the art as a step recovery diode or charge-storage diode. It is described by J. L. Moll, S. Krakauer, and R. Shen in an article entitled "P-N Junction Charge-Storage Diodes" and published on pages 43 to 53, inclusive, of volume 50, No. 1, of the Proceedings of the IRE for January 1962. As is described in this article, this type of diode is designed to have finite carrier lifetime so as to conduct for a period of time in the reverse direction.

The junction of the diode 20 is built with retarding fields for minority carriers in order to constrain storage to the vicinity of the junction. When the stored minority carriers are depleted, a very abrupt step in current occurs. In other words, when the diode 20 recovers at the end of its storage time, it snaps off quickly thereby producing a sudden change in the current.

This steep reverse step is utilized in the circuit of FIG. 4 to determine the fall time of a pulse produced by the thyristor 1. In other words, the abrupt drop in the current through the diode 20 at the end of its storage, or reverse recovery, time produces a corresponding fast fall time for a pulse generated by the thyristor 1. In addition, it should be noted that, in this circuit, the thyristor 1 functions in the manner of an amplifier to provide an output pulse having much more power than could be provided by the diode 20.

In connecting the step recovery diode 20 into the circuit of FIG. 4, the lead 15, which is shown in the other circuits to extend between the points 17 and 16, is omitted. The point 17 is now connected in FIG. 4 by a lead 21 to the cathode of the diode 20, and the point 16 is connected by a lead 22 to a point 23 between the resistor 19 and the anode of the diode 20. This circuit construction serves to couple the upper side of the resonant turn-off circuit through the diode 20 to the anode terminal 2 of the thyristor 1.

It can be seen that, instead of using a fast recovery diode 13 as in the circuits of FIGS. 1 and 3, the circuit of FIG. 4 is like the circuit of FIG. 2 in that it employs a Zener diode 28 having a fast reverse recovery time which is the same as that of the diode 13 and which is less than the reverse recovery time of the middle junction J2 in the thyristor 1.

The thyristor circuit of FIG. 4 is normally open, as was the case with the circuit of FIG. 1, due to the relatively high impedance that now exists between the anode terminal 2 and the cathode terminal 3. Since there is no conventional source of trigger pulse current in the circuit of FIG. 4, it is put into operation by causing the power supply voltage at the source 5 to have a value greater than the reverse breakdown voltage of the Zener diode 28 thereby effecting its breakdown. This permits current from the source 5 to flow through the resistor 19, along the lead 22 to the point 16, and then in the reverse direction through the Zener diode 28 to the gate terminal 4 thereby firing the thyristor 1 and starting the formation of a pulse.

The capacitor 12 now discharges and initiates a flow of ringing current through the inductor 11 to the point 16, along the lead 22 to the point 23, through the step recovery diode 20, and then along the lead 21 to the anode terminal 2 of the thyristor 1. The total current that will now flow through the thyristor 1 will be the sum of the load current through the load resistor 6, the auxiliary current through the resistor 19, and the initial half-cycle of the ringing current. During this first half-cycle of the ringing current, the step recovery diode 20 will accumulate a stored charge.

The second half-cycle of the ringing current provides the reverse current for turning off the thyristor 1, in the manner described above, while leaving the stored charge in the step recovery diode 20. Because of this stored charge, the pulse across the load resistor 6 is now maintained due to the pulse current across the load resistor 6 flowing in the reverse direction through the step recovery diode 20 and being superimposed upon the reverse ringing current which is flowing through the slow recovery diode 14 and the Zener diode 28. The pulse current continues to flow through the step recovery diode 20 until its stored charge is depleted. At this point, the diode 20 will recover by its snap action thereby producing the above-mentioned abrupt reverse step for terminating the pulse in a sudden fall time.

As the storage time of the step recovery diode 20 is an important factor in terminating a pulse produced by this switch circuit, it should be noted that this diode 20 is so constructed that its storage time is no shorter than, and preferably is slightly longer than, the turn-off time, or forward-blocking recovery time, of the thyristor 1. In other words, the middle junction J2 in the thyristor 1 must recover by recombination before the diode 20 recovers by its snap action. Therefore, very shortly after the middle junction J2 recovers its forward-blocking capability, the step recovery diode 20 will recover thereby producing the above-mentioned abrupt reverse step which now functions to block any flow of current through the load resistor 6.

Therefore, a pulse generated by this switch circuit will be terminated in a sudden fall time corresponding to the abrupt reverse step of the diode 20. Thus, the fall time of a pulse produced by the circuit of FIG. 4 will be materially shorter than the fall time of a pulse generated by any of the circuits shown in FIGS 1, 2, and 3.

The termination of the pulse allows charging voltage to again be applied to the capacitor 12 over a path extending from the power supply source 5, through the resistor 19, along the lead 22 to the point 16, and then through the inductor 11 to the capacitor 12. When the potential at the point 16 reaches a value that is slightly greater than the reverse breakdown voltage of the Zener diode 28, it will again effect the breakdown of the Zener diode 28. This will function to fire the thyristor 1 again thereby starting the generation of another pulse across the load resistor 6.

Thus, the circuit of FIG. 4 functions in the manner of an astable oscillator to repetitively generate a train of square wave pulses with each pulse having a rapid fall time. The operation of the circuit of FIG. 4 is stopped in the same manner as that described above for the circuits of FIGS. 1, 2, and 3; namely, by reducing the value of the voltage from the power supply source 5 so that the point 16 will not be able to acquire a potential sufficient to effect the breakdown of the Zener diode 28.

The interpulse spacing or frequency of the pulses is determined by the time required for the point 16 to acquire a potential sufficient to effect the breakdown of the Zener diode 28. Therefore, the frequency of the pulses can be varied by suitably varying the time required for the point 16 to acquire the necessary potential. This can be conveniently accomplished in the circuit of FIG. 4 by simply varying the value of the resistor 19.

What is claimed is:

1. A repetitively operating switch circuit having rapid turn-off action:
- said switch circuit comprising only one thyristor,
- said thyristor having four layers forming three junctions between them,
- said four layers including two outer layers and two intermediate layers,
- said three junctions including a middle junction having an inherent reverse recovery time,
- an anode terminal connected to one of said outer layers,
- a cathode terminal connected to the other of said outer layers,
- a gate terminal connected to one of said intermediate layers,
- said switch circuit further comprising a source of direct voltage,
- a load impedance for coupling said source to said thyristor,
- said load impedance having a first end connected to said source and a second end connected to said anode terminal,
- a series-resonant turn-off circuit adapted for turning off said thyristor,
- first circuit means for connecting one side of said turn-off circuit to said cathode terminal,
- second circuit means for connecting another side of said turn-off circuit to said anode terminal and to said second end of said load impedance,
- said switch circuit being characterized in that it further includes means for repetitively firing said thyristor and for increasing the rapidity of the turn-off action,
- said last-mentioned means comprising a Zener diode having an anode and a cathode,
- said anode being connected to said gate terminal,
- coupling means for coupling said cathode to said second end of said load impedance,
- and a diode connected between said cathode terminal and said gate terminal,
- said diode having an inherent reverse recovery time longer than that of said middle junction,
- and said Zener diode having a fast inherent reverse recovery time less than that of said middle junction.

2. A switch circuit in accordance with claim 1 wherein said coupling means include a step recovery diode having a cathode and an anode:

said cathode of said step recovery diode being connected to said second end of said load impedance, and said anode of said step recovery diode being connected to said cathode of said Zener diode.

3. A switch circuit in accordance with claim 2 and further comprising a resistor for coupling the anode of said step recovery diode and also the cathode of said Zener diode to said first end of said load impedance.

References Cited

UNITED STATES PATENTS 3,045,148 8/1962 McNulty et al. ------ 331—111

FOREIGN PATENTS 958,008 5/1963 Great Britain.

JOHN KOMINSKI, *Primary Examiner.*